(12) United States Patent
Shrivastava

(10) Patent No.: US 8,283,948 B2
(45) Date of Patent: Oct. 9, 2012

(54) CAPACITOR NONLINEARITY CORRECTION

(75) Inventor: Neeraj Shrivastava, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 244 days.

(21) Appl. No.: 12/757,773

(22) Filed: Apr. 9, 2010

(65) Prior Publication Data

US 2010/0259302 A1    Oct. 14, 2010

(30) Foreign Application Priority Data

Apr. 13, 2009   (IN) .............................. 846/CHE/2009

(51) Int. Cl.
*H03K 5/00*   (2006.01)
(52) U.S. Cl. .......................................................... 327/95
(58) Field of Classification Search ...................... 327/94
See application file for complete search history.

(56) References Cited

U.S. PATENT DOCUMENTS

| 5,206,543 A | 4/1993 | Takita et al. |
| 6,084,440 A | 7/2000 | Sousa |
| 7,236,038 B2 * | 6/2007 | Wu ................................ 327/291 |
| 2007/0040588 A1 * | 2/2007 | Braswell et al. ................. 327/94 |
| 2007/0064371 A1 * | 3/2007 | Salerno ......................... 361/113 |

FOREIGN PATENT DOCUMENTS

EP    0910096    4/1999

* cited by examiner

*Primary Examiner* — Lincoln Donovan
*Assistant Examiner* — Daniel Rojas
(74) *Attorney, Agent, or Firm* — John J. Patti; Wade J. Brady, III; Frederick J. Telecky, Jr.

(57) ABSTRACT

A sample-and-hold (S/H) circuit is provided. The S/H circuit generally comprises a sampling switch, a sampling capacitor, and a correction network. The sampling switch that receives an analog input signal is actuated and deactuated by a timing signal. The sampling capacitor is coupled to the sampling switch at a sampling node so as to receive the analog input signal when the sampling switch is actuated and to store a voltage of the analog input signal when the sampling switch is deactuated. The correction network has at least one row of varactor cells such that each varactor cell is coupled to the sampling node and wherein each varactor cell in the row receives a reference voltage. Additionally, each varactor cell receives at least one of a plurality of control signals.

13 Claims, 5 Drawing Sheets

CAPACITOR NONLINEARITY CORRECTION

CROSS-REFERENCE TO RELATED APPLICATIONS

This application claims priority from Indian Patent Application No. 846/CHE/2009, filed Apr. 13, 2009, which is hereby incorporated by reference for all purposes.

TECHNICAL FIELD

The invention relates generally to correction of capacitor nonlinearities and, more particularly, to correcting capacitor nonlinearities for sample-and-hold circuits.

BACKGROUND

Referring to FIG. 1 of the drawings, the reference numeral 100 generally designates a conventional sample-and-hold (S/H) circuit. S/H circuit 100 generally comprises a source 102, a sampling switch S1, and sampling capacitor CS. In operation, source 102 (which has an internal resistance RS) supplies an analog input signal to switch S1. Switch S1 is generally a linear switch having an internal resistance RSH. When switch S1 is actuated, the analog input signal passes to the sampling capacitor CS, so that the capacitor CS can sample the voltage of the analog input signal. When switch S1 is deactuated, capacitor CS holds or stores the voltage of the analog input signal that was sampled.

A problem with this configuration is that capacitor CS is linear, but there is usually an internal nonlinear capacitance CNL. This nonlinear capacitance CNL, when capacitor CS is sampling the analog input signal, causes the capacitor to drawn a nonlinear current. This nonlinear current draw, in turn, causes the final sampled signal to be distorted, predominantly with the third harmonic if the circuit 100 is differential or predominantly with the second harmonic if the circuit 100 is single ended. In particular, this nonlinear current draw is proportional to the rate of change of the terminal voltage, so that the distortion increases with frequency, limiting Spurious-Free Dynamic Range (SFDR) performance in analog-to-digital converter (ADC) applications.

Conventional solutions includes the use of multiple ADCs and differentiators that use the I and Q components of the analog input signal. However, these solutions consume a great deal of power and use a great deal of area. Other conventional circuits are European Patent No. 0910096; U.S. Pat. No. 5,206,543; and U.S. Pat. No. 6,084,440.

SUMMARY

A preferred embodiment of the present invention, accordingly, provides an apparatus. The apparatus comprises a sampling switch that receives an analog input signal and that is actuated and deactuated by a timing signal; a sampling capacitor that is coupled to the sampling switch at a sampling node, wherein the sampling capacitor receives the analog input signal when the sampling switch is actuated, and wherein the sampling capacitor stores a voltage of the analog input signal when the sampling switch is deactuated; and a correction network having at least one row of varactor cells, wherein each varactor cell is coupled to the sampling node, and wherein each varactor cell in the row receives a reference voltage, and wherein each varactor cell receives at least one of a plurality of control signals.

In accordance with a preferred embodiment of the present invention, each varactor cell of the row further comprises a varactor that is coupled to the sampling node; and an actuation circuit that is coupled to the varactor and that receives the reference voltage and at least one of the control signals.

In accordance with a preferred embodiment of the present invention, the varactor further comprises an NMOS capacitor.

In accordance with a preferred embodiment of the present invention, the varactor further comprises an PMOS capacitor.

In accordance with a preferred embodiment of the present invention, the varactor further comprises an PN junction varactor.

In accordance with a preferred embodiment of the present invention, the apparatus further comprises a matching network that is coupled to the sampling switch and that receives the analog input signal.

In accordance with a preferred embodiment of the present invention, the apparatus further comprises a boost circuit that is coupled to the control electrode of the sampling switch and that provides the timing signal to the sampling switch.

In accordance with a preferred embodiment of the present invention, an apparatus is provided. The apparatus comprises a sampling switch that receives an analog input signal and that is actuated and deactuated by a timing signal; a sampling capacitor that is coupled to the sampling switch at a sampling node, wherein the sampling capacitor receives the analog input signal when the sampling switch is actuated, and wherein the sampling capacitor stores a voltage of the analog input signal when the sampling switch is deactuated; and a correction network having a plurality of varactor cells arranged in a plurality of rows and columns, wherein: each varactor cell is coupled to the sampling node; each varactor cell within each row receives at least one of a plurality of reference voltages; and each varactor cell within each column receives at least one of a plurality of control signals.

In accordance with a preferred embodiment of the present invention, an apparatus is provided. The apparatus comprises a sampling switch that receives an analog input signal and that is actuated and deactuated by a timing signal; a boost circuit that is coupled to the control electrode of the sampling switch and that provides the timing signal to the sampling switch; a sampling capacitor that is coupled to the sampling switch at a sampling node, wherein the sampling capacitor receives the analog input signal when the sampling switch is actuated, and wherein the sampling capacitor stores a voltage of the analog input signal when the sampling switch is deactuated; and a correction network having a plurality of varactor cells arranged in a first row, a second row, a first column, and a second column, wherein: each varactor cell is coupled to the sampling node; each varactor cell within the first row receives a first reference voltage; each varactor cell within the first row receives a second reference voltage; each varactor cell within the first column receives a first control signal that is adapted to actuate each varactor cell of the first column; and each varactor cell within the second column receives a second control signal that is adapted to actuate each varactor cell of the first column.

In accordance with a preferred embodiment of the present invention, each varactor cell further comprises a MOS capacitor that is coupled to the sampling node; and an actuation circuit that is coupled to the MOS capacitor.

In accordance with a preferred embodiment of the present invention, the apparatus further comprises a matching network that is coupled to the sampling switch and that receives the analog input signal.

In accordance with a preferred embodiment of the present invention, the apparatus an electrostatic discharge (ESD) circuit that is coupled to the matching network.

In accordance with a preferred embodiment of the present invention, the apparatus further comprises a second sampling switch that is coupled to the sampling capacitor.

In accordance with a preferred embodiment of the present invention, the apparatus further comprises digital-to-analog converter (DAC) switches that are coupled to the sampling node.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
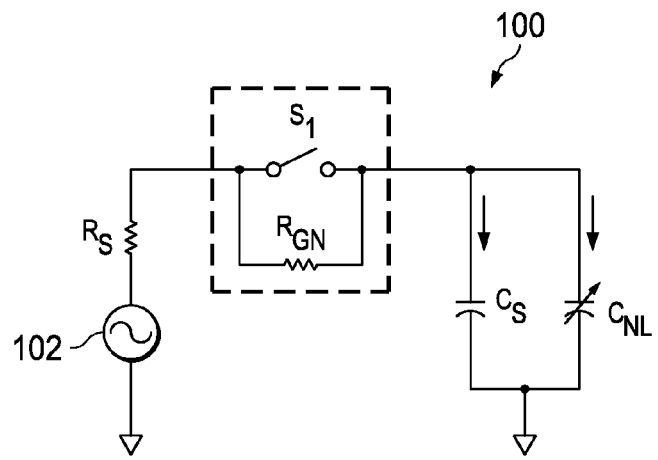
FIG. 1 is a circuit diagram of a conventional S/H circuit.

Refer now to the drawings wherein depicted elements are, for the sake of clarity, not necessarily shown to scale and wherein like or similar elements are designated by the same reference numeral through the several views.

Figure 2:
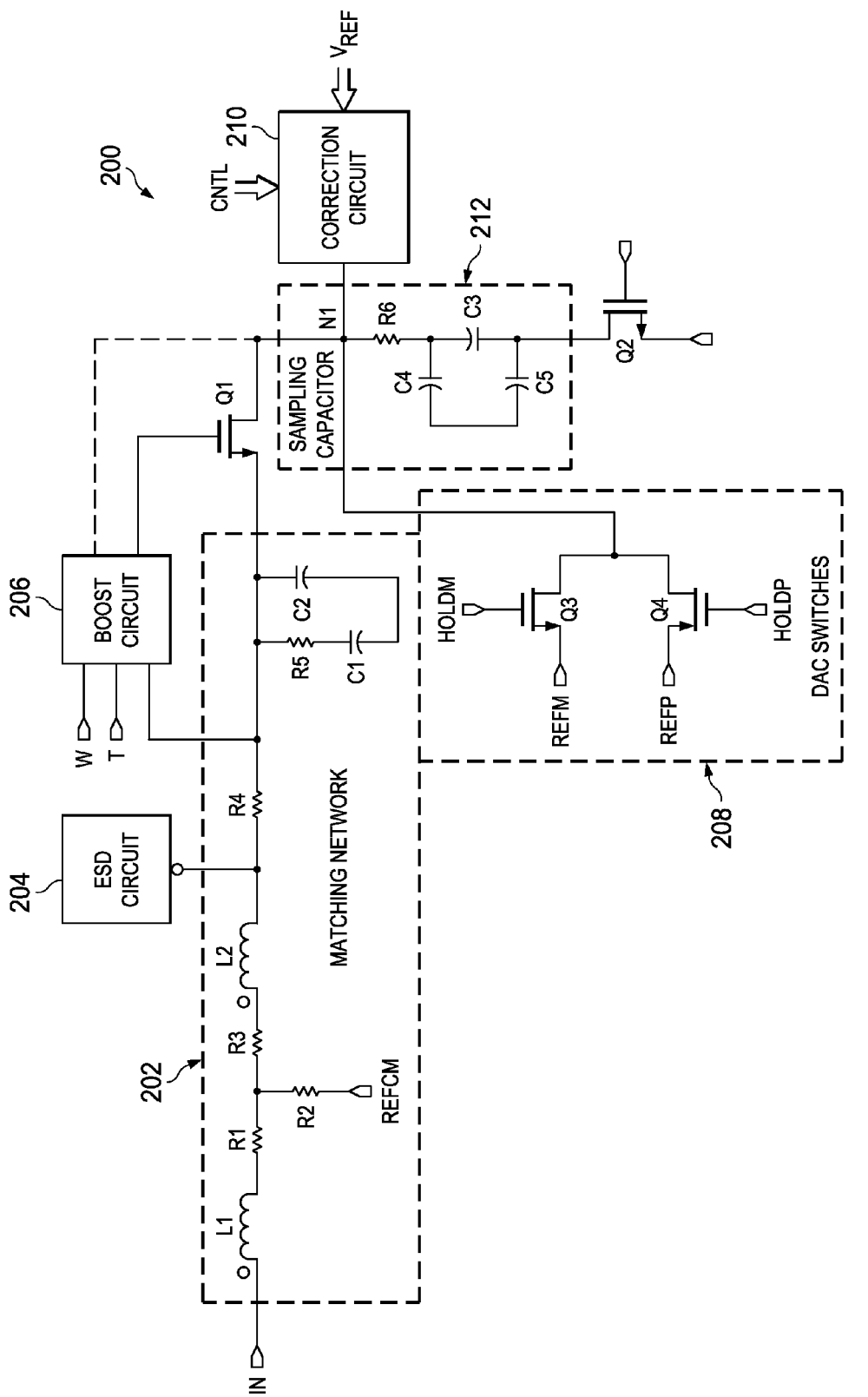
FIG. 2 is a circuit diagram of at least a portion of an S/H circuit in accordance with a preferred embodiment of the present invention.

Referring to FIG. 2 of the drawings, the reference numeral 200 generally designates an S/H circuit in accordance with a preferred embodiment of the present invention. S/H circuit 200 generally comprises a matching network 202, an electrostatic discharge (ESD) circuit 204, a boost circuit 206, sampling switches Q1 and Q2, digital-to-analog converter (DAC) switches 208, correction network 210, and sampling capacitor 212.

First, turning to the matching network 202 and ESD circuit 204, they generally operate to provide impedance matching, ESD protection, as well as other functions. Inductor L1 (which preferably has a value of about 40 nH) and resistors R1 and R2 (which preferably have values of 25Ω) generally comprise a source network so as to generally introduce a common mode reference voltage REFCM to the analog input signal. Resistors R3, R4, and R5 (which preferably have values of about 20Ω, 10Ω, and 100Ω, respectively), inductor L2 (which preferably has a value of about 5 nH), and capacitors C1 and C2 (which preferably have values of about 3 pF and 3.2 pF, respectively) generally represent parasitic components and internal termination or impedance matching components. The ESD circuit 204 is generally coupled to the matching network 202 so as to detected transients or ESD events and protect other circuit from these ESD events.

The boost circuit 206 generally operates to assisting in linearizing circuit 200. The boost circuit 206 generally receives a hold signal H, a track signal T (which is generally the inverse of the hold signal H), and the analog input signal from the matching network 202. Preferably, the boost circuit 206 outputs a timing signal that is generally in synchronization with the track and hold signals T and H and that is of a sufficient power level to actuate sampling switch Q1. Boost circuit 206 may also separately use a correction circuit 210 (which is described below) because it has characteristics that are similar to sampling capacitor 212 (which is also described below).

Sampling switch Q1 is preferably an NMOS transistor that is coupled between the matching network 202 and sampling node N1. This switch Q1 generally operates to allow the analog input signal from the matching network 202 to pass to the sampling node N1, when actuated by the timing signal that is received at its gate during a sample phase. The switch Q1 also prevents the analog input signal from passing to the sampling node N1, when deactuated by the timing signal during a hold phase.

Coupled to the sampling node N1 is the sampling capacitor 212. Sampling capacitor 212 is generally comprised of capacitor C3 (which preferably has a value of about 4 pF). Capacitor C3 also generally includes several internal parasitic components, which are as follows: resistor R6 (which preferably has a value of about 96Ω); and capacitors C4 and C5 (which preferably have values of 2 pF and 4 fF, respectively). This sampling capacitor 212 generally operates to sample the voltage of the analog input signal during a sample phase and hold or store the voltage during a hold phase.

Also coupled to the sampling node N1 are the DAC switches 208. The DAC switches are generally comprised of NMOS transistors Q3 and Q4. Each of these transistors Q3 and Q4 receive a negative reference voltages REFM and a positive reference voltage REFP (respectively), which can be passed onto the sampling node N1, when the respective signal HOLDM and HOLDP are logic high.

Sampling switch Q2 is also coupled to the sampling capacitor 212. Preferably, switch Q2 is an NMOS transistor. This switch Q2 generally allows the charge on a plate of sampling capacitor 212 to be sampled when the switch Q2 is actuated.

When the circuit 100 is in operation, however, sampling capacitor 212 is plagued with a similar problem to capacitor CS of circuit 100 in that it, too, can have a nonlinear current draw. To reduce the effects, a correction circuit 210 is provided and is coupled to the sampling node N1. This correction circuit 210 receives one or more control signal (labeled CNTL) and one or more reference voltages (labeled VREF), which allow this correction to occur.

Figure 3:
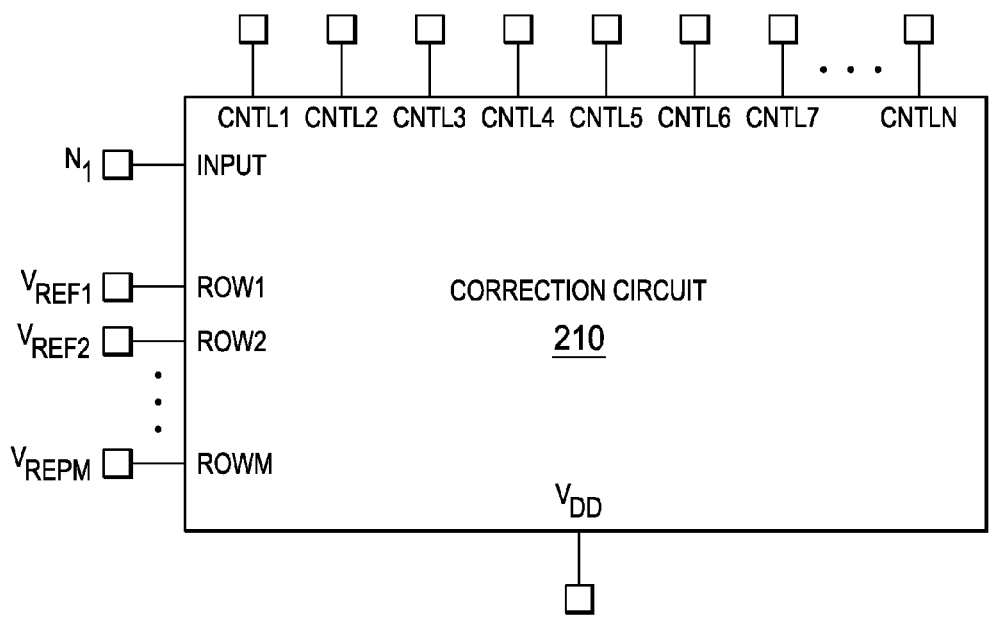
FIG. 3 is a block diagram of an example of the correction circuit of FIG. 2.

Turning to FIG. 3, a block diagram of an example of the correction circuit 210 can be seen. The correction circuit 210 can receive a number of control signals CNTL1 to CNTLn. Preferably, for ADC application, 16 control signals are employed. These control signals CNTL1 to CNTLn are each generally associated with one or more rows of varactor cells (described below). Additionally, correction circuit 210 can receive a number of reference voltages VREF1 to VREFm, where each reference voltage is associated with one or more rows of varactor cells. Preferably, for ADC application, seven rows are employed, and the reference voltages are about 0V, 0.2V, 0.4V, 0.6V, 0.8V, 1.0V, and 1.2V.

Figure 4:
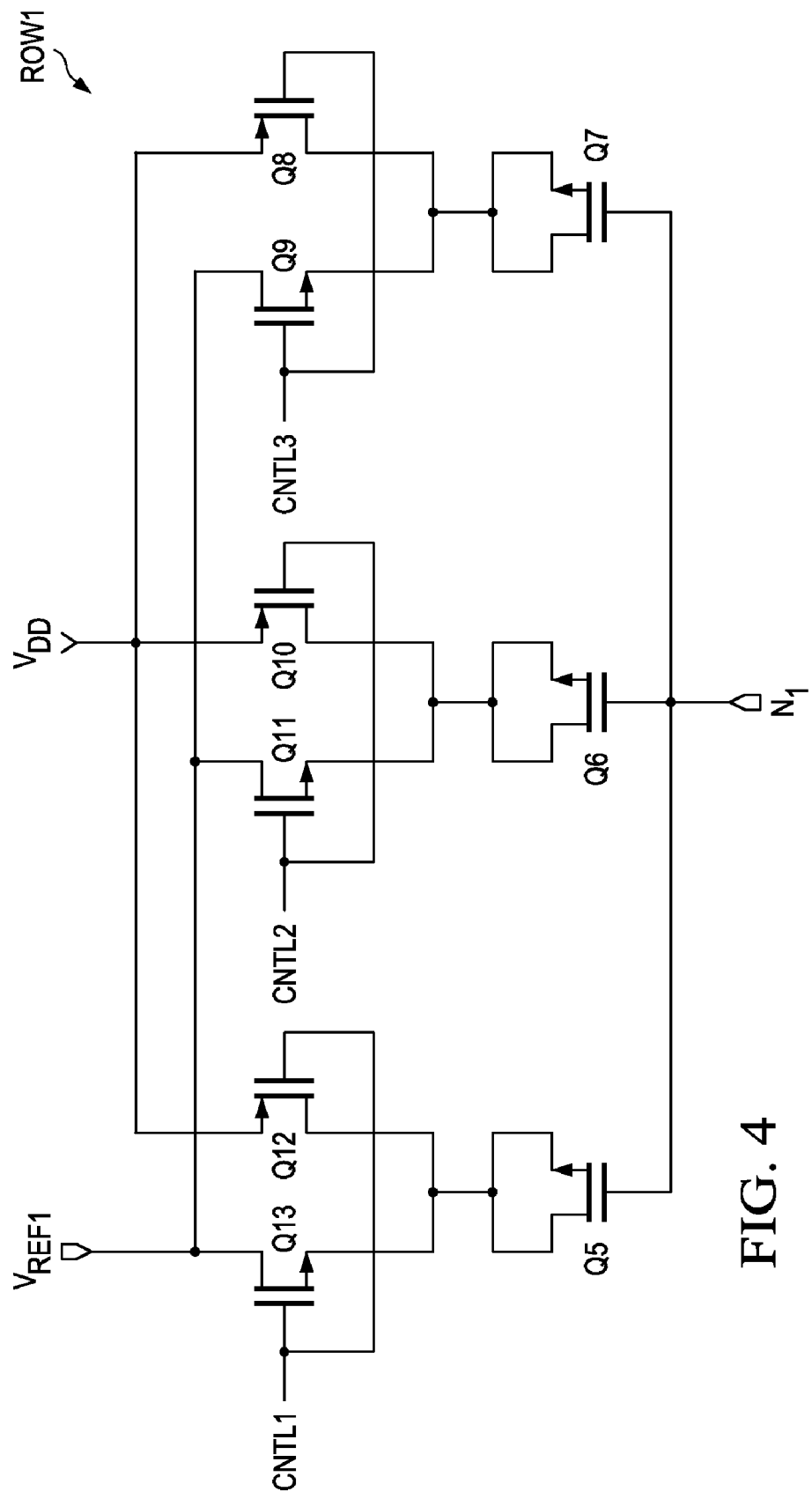
FIG. 4 is a circuit diagram of an example of ROW1 of the correction circuit of FIG. 3.

Turning to FIG. 4, a circuit diagram of an example of ROW1 can be seen. In FIG. 4, three varactor cells are show. Each varactor cell is generally comprised of a NMOS capacitor or MOS varactor Q5, Q6, and Q7 and actuation circuit which coupled to each capacitor Q5, Q6, and Q7. In alternative configurations, NMOS capacitors Q5, Q6, and Q7 can be replaced with PMOS capacitors or PN junction varactors. Additionally, each NMOS transistor Q5, Q6, and Q7 is coupled to sampling node N1. Each actuation circuit is generally comprised of transistor pairs Q8/Q9, Q10/Q11, and Q12/Q13 that are each actuated by a control signal CNTL1, CNTL2, or CNTL3 that is associated with the varactor cell's column. When actuated, the actuation circuit couples the power supply voltage VDD and reference VREF1 to its associated NMOS capacitor Q5, Q6, or Q7. This particular arrangement allows for current to be to provided or removed from sampling capacitor 212 to generally counteract or reduce the nonlinear current draw associated with sampling capacitor 212. Additionally, it should be noted that each of the rows of correction circuit 210 generally take the form of the example of ROW1 depicted in FIG. 4 and that the example of ROW1 depicted in FIG. 4 can be expanded to have the desired number of columns. These columns can also be actuated in different sequences, as desired, to reduce the effect of the nonlinear current draw of sampling capacitor 212.

Figure 5:
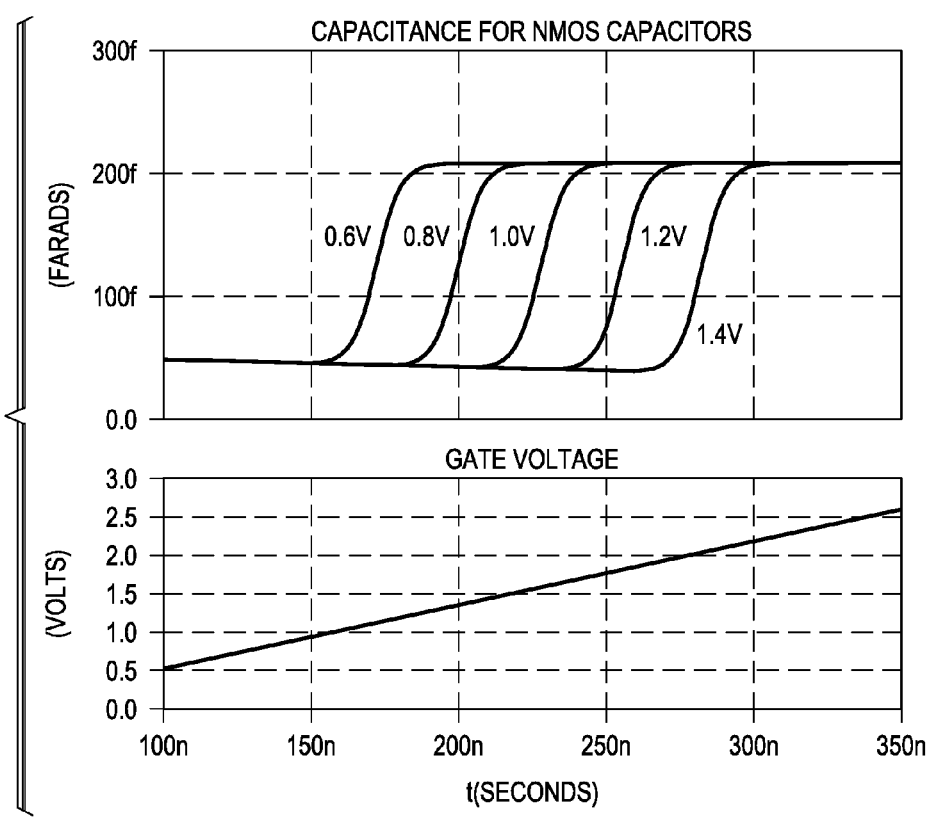
FIG. 5 is a graph depicting an example of the operation of an row of the correction circuit of FIG. 3 employing NMOS capacitors.
Figure 6:
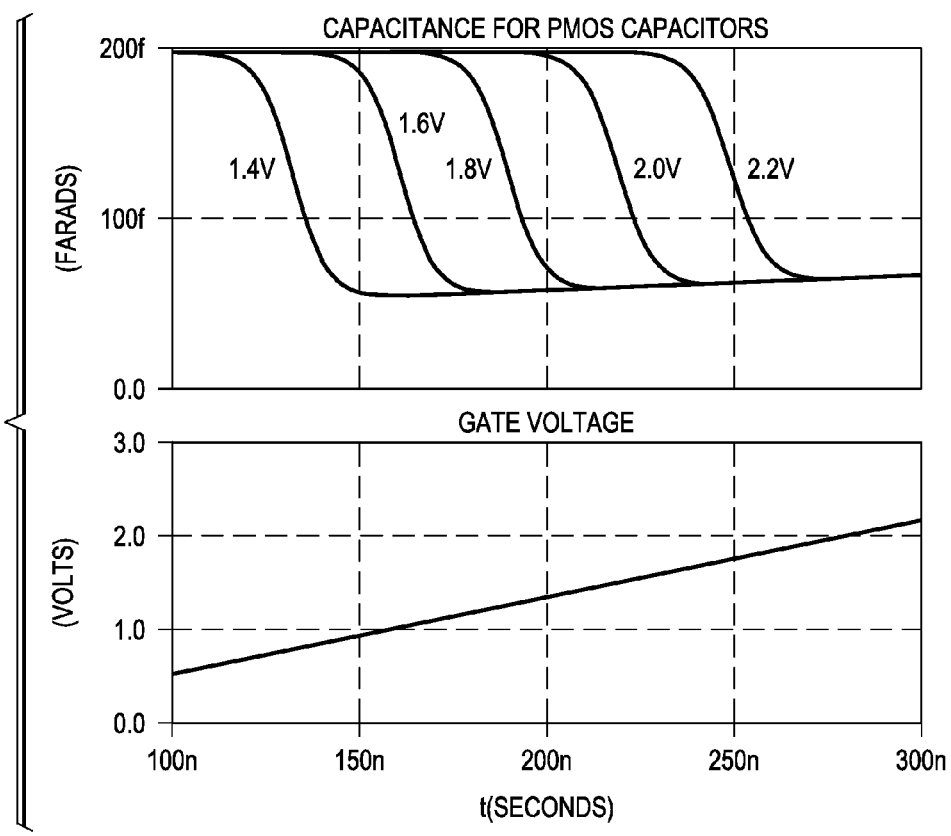
FIG. 6 is a graph depicting an example of the operation of an row of the correction circuit of FIG. 3 employing PMOS capacitors.

A reason for the functionality of correction circuit 210 can be seen in FIGS. 5 and 6. As can been seen, the capacitive characteristics of the MOS varactors or NMOS and PMOS capacitors vary depending on the gate voltage and source-drain voltage. In FIG. 5, the capacitances for varactor cells (employing NMOS capacitors) transition from about 50 fF to about 200 fF, but depending on the source-drain voltages (which range from 0.6V to 1.4V) the transitions occur different times as the gate voltage rises. In FIG. 6, the capacitances for varactor cells (employing PMOS capacitors) transition from about 200 fF to about 50 fF, but depending on the source-drain voltages (which range from 1.4V to 2.2V) the transitions occur different times as the gate voltage rises.

Figure 7:
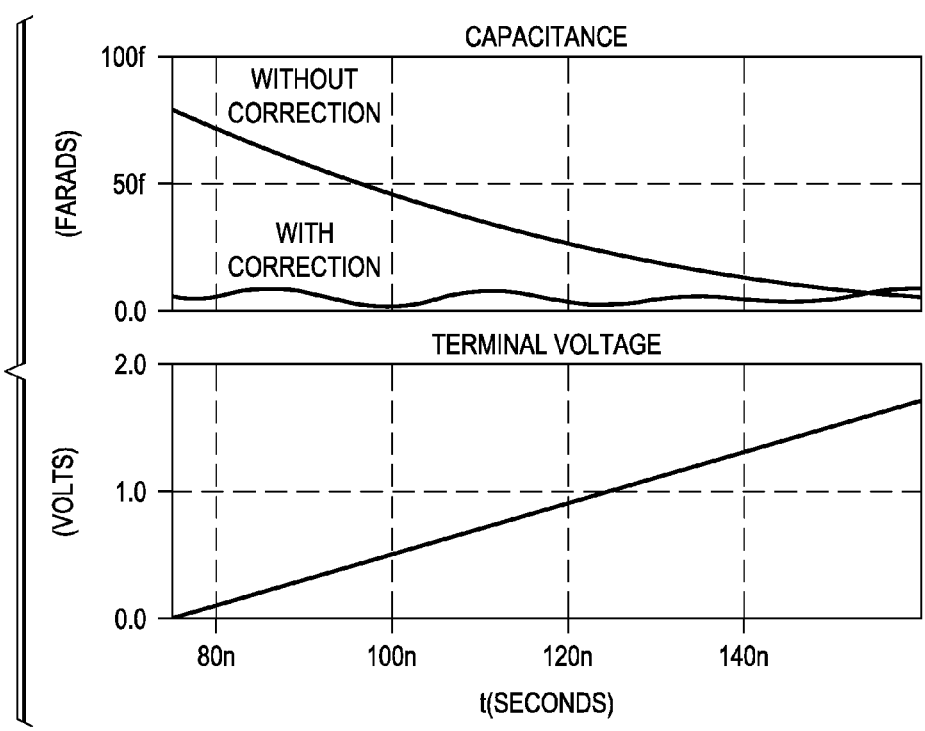
FIG. 7 is a graph depicting an example of the operation of the sampling capacitor of FIG. 2 with and without correction.

Turning to FIG. 7, a comparison of the operations of circuit 200 with and without correction can be seen. In FIG. 7, the nonlinear current draw by sampling capacitor 212 (manifested as a varying capacitance) can be seen varying from about 75 fF to about 7 fF as the terminal voltage increases when no correction is applied. When correction is applied, the variance remains within a predetermined range of a few femtoFarads near 7 fF.

This circuit, thus, has numerous advantages over other conventional designs. When circuit 200 has been applied to ADC applications, there has been a 13 dB gain in the third harmonic. Additionally, for ADCs without correction, the HD3 was noted to be greater than 73 dB for frequencies of less than 230 MHz, and for ADCs with corrections, the HD3 was noted to be greater than 90 dB for the same frequency range. Thus, the use of circuit 200 allows for greatly improved performance without using a large amount of area.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

The invention claimed is:

1. An apparatus comprising:
   a sampling switch that receives an analog input signal and that is actuated and deactuated by a timing signal;
   a sampling capacitor that is coupled to the sampling switch at a sampling node, wherein the sampling capacitor receives the analog input signal when the sampling switch is actuated, and wherein the sampling capacitor stores a voltage of the analog input signal when the sampling switch is deactuated; and
   a correction network having a plurality of varactor cells arranged in a plurality of rows and columns, wherein:
     each varactor cell is coupled to the sampling node;
     each varactor cell within each row receives at least one of a plurality of reference voltages; and
     each varactor cell within each column receives at least one of a plurality of control signals.

2. The apparatus of claim 1, wherein each varactor cell of the row further comprises:
   a varactor that is coupled to the sampling node; and
   an actuation circuit that is coupled to the varactor and that receives at least one of the reference voltages and at least one of the control signals.

3. The apparatus of claim 2, wherein the varactor further comprises an NMOS capacitor.

4. The apparatus of claim 2, wherein the varactor further comprises an PMOS capacitor.

5. The apparatus of claim 2, wherein the varactor further comprises an PN junction varactor.

6. The apparatus of claim 1, wherein the apparatus further comprises a matching network that is coupled to the sampling switch and that receives the analog input signal.

7. The apparatus of claim 1, wherein the apparatus further comprises a boost circuit that is coupled to the control electrode of the sampling switch and that provides the timing signal to the sampling switch.

8. An apparatus comprising:
   a sampling switch that receives an analog input signal and that is actuated and deactuated by a timing signal;
   a boost circuit that is coupled to the control electrode of the sampling switch and that provides the timing signal to the sampling switch;
   a sampling capacitor that is coupled to the sampling switch at a sampling node, wherein the sampling capacitor receives the analog input signal when the sampling switch is actuated, and wherein the sampling capacitor stores a voltage of the analog input signal when the sampling switch is deactuated; and
   a correction network having a plurality of varactor cells arranged in a first row, a second row, a first column, and a second column, wherein:
     each varactor cell is coupled to the sampling node;
     each varactor cell within the first row receives a first reference voltage;
     each varactor cell within the first row receives a second reference voltage;
     each varactor cell within the first column receives a first control signal that is adapted to actuate each varactor cell of the first column; and
     each varactor cell within the second column receives a second control signal that is adapted to actuate each varactor cell of the first column.

9. The apparatus of claim 8, wherein each varactor cell further comprises:
   a MOS capacitor that is coupled to the sampling node; and an actuation circuit that is coupled to the MOS capacitor.

10. The apparatus of claim 8, wherein the apparatus further comprises a matching network that is coupled to the sampling switch and that receives the analog input signal.

11. The apparatus of claim 10, wherein the apparatus an electrostatic discharge (ESD) circuit that is coupled to the matching network.

12. The apparatus of claim 8, wherein the apparatus further comprises a second sampling switch that is coupled to the sampling capacitor.

13. The apparatus of claim 8, wherein the apparatus further comprises digital-to-analog converter (DAC) switches that are coupled to the sampling node.

\* \* \* \* \*